United States Patent [19]

Ahn

[11] Patent Number: 5,886,873
[45] Date of Patent: Mar. 23, 1999

[54] HEAT DISSIPATING DEVICE FOR AN ELECTRONIC DEVICE PACKAGE

[75] Inventor: Seong-Ick Ahn, Seoul, Rep. of Korea

[73] Assignee: Daewoo Electronics Co., Ltd., Rep. of Korea

[21] Appl. No.: 845,489

[22] Filed: Apr. 25, 1997

[30] Foreign Application Priority Data

Apr. 30, 1996 [KR] Rep. of Korea ............... 96-13764

[51] Int. Cl.$^6$ .................................................. H05K 7/20
[52] U.S. Cl. ........................ 361/719; 24/563; 257/727; 361/704
[58] Field of Search ...................... 165/80.3, 185; 24/455, 458, 555, 563, 570; 248/231.81, 316.7, 680, 681; 403/228, 405.1; 174/16.3; 267/150, 158, 160; 257/718, 719, 717; 361/687, 703, 697, 704, 709, 710, 711, 717–719

[56] References Cited

U.S. PATENT DOCUMENTS 5,099,550  3/1992  Beane et al. .
5,299,632  4/1994  Lee .
5,367,433  11/1994  Blomquist .
5,371,652  12/1994  Clemens et al. .
5,436,798  7/1995  Wieland, Jr. .
5,521,439  5/1996  Casati ........................... 361/719
5,586,005  12/1996  Cipolla ......................... 361/704
5,594,624  1/1997  Clemens ...................... 361/704
5,699,229  12/1997  Brownell ...................... 361/719

FOREIGN PATENT DOCUMENTS 0295387  12/1988  European Pat. Off. .
2193839  2/1988  United Kingdom .
9316580  8/1993  WIPO .

Primary Examiner—Gerald Tolin
Attorney, Agent, or Firm—Pennie & Edmonds LLP

[57] ABSTRACT

A device for dissipating heat generated from an electronic device package located above an upper face of a printed circuit board. This device can be a heat sink having a base in contact with an upper face of the electronic device package, and at least one fin formed on the base to dissipate the heat from said electronic device package. This device also has a pair of clips for clamping the base of the heat sink to the electronic device package to maintain a close thermal contact between the heat sink and the electronic device package.

8 Claims, 3 Drawing Sheets

HEAT DISSIPATING DEVICE FOR AN ELECTRONIC DEVICE PACKAGE

FIELD OF THE INVENTION

The present invention relates to a heat dissipating device for an electronic device package; and, more particularly, to a heat dissipating device capable of effectively dissipating heat from the electronic device package.

DESCRIPTION OF THE PRIOR ART

Generally, electronic appliances such as a video cassette recorder or a compact disk player etc., incorporates therein electronic device packages, each of the electronic device packages for controlling the function of a given driving unit etc. Some of the electronic packages generate heat during the operation thereof, which must be dissipated in order to ensure an optimum operating condition therefor, and to this end, each of these packages is usually provided with a heat dissipating device.

For example, there is disclosed in FIG. 1 a capstan motor assembly 20 of the video cassette recorder incorporating therein a heat dissipating device. The capstan motor assembly 20 includes a stator 23, a rotor 22 and an electronic device package 24 for controlling the operation thereof respectively assembled on top of a printed circuit board 21. In the capstan motor assembly 20, the heat generated during the operation of the electronic device package 24 is dissipated through the printed circuit board 21. Since the printed circuit board 21 is usually made of a material, e.g., plastic, having a low thermal conductivity, in the capstan motor assembly 20, in order to sufficiently dissipate the heat generated by the electronic device package 24, a considerably large printed circuit board is usually needed. However, such a need unnecessarily puts a limitation on the designing of the video cassette recorder.

SUMMARY OF THE INVENTION

It is, therefore, a primary object of the invention to provide a heat dissipating device of an electronic device package which is capable of effectively and efficiently dissipating the heat generated during an operation thereof.

The above and other objects of the invention are accomplished by providing a device for dissipating heat generated from an electronic device package being spaced apart from an upper face of a printed circuit board, said device comprising: a heat sink having a base in contact with an upper face of said electronic device package and at least one fin formed on said base to dissipate the heat from said electronic device package; and a pair of clips for clamping the base and the electronic device package positioned beneath the base in order to maintain a close thermal contact between the base and the electronic device package.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

A preferred embodiment of an inventive heat dissipating device for an electronic device package is now described with reference to FIGS. 2 through 4.

Figure 1:
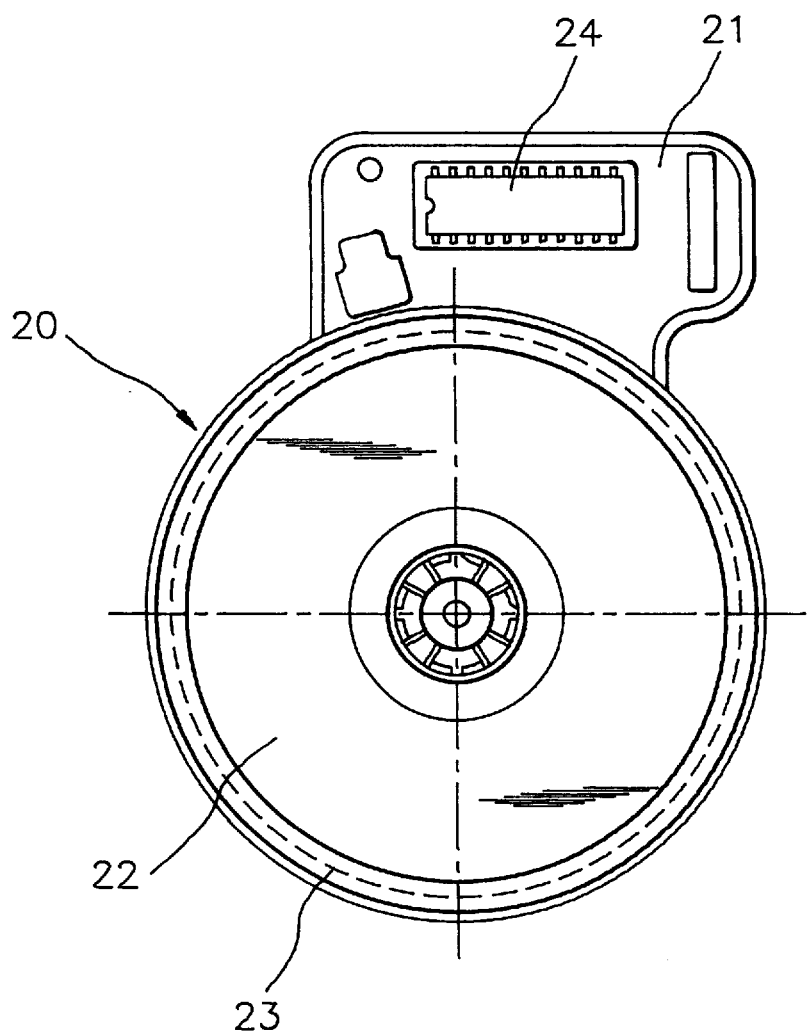
FIG. 1 illustrates a top plan view of a capstan motor assembly in a video cassette recorder showing a prior art device for dissipating heat from an electronic device package used to control the capstan motor assembly.
Figure 2:
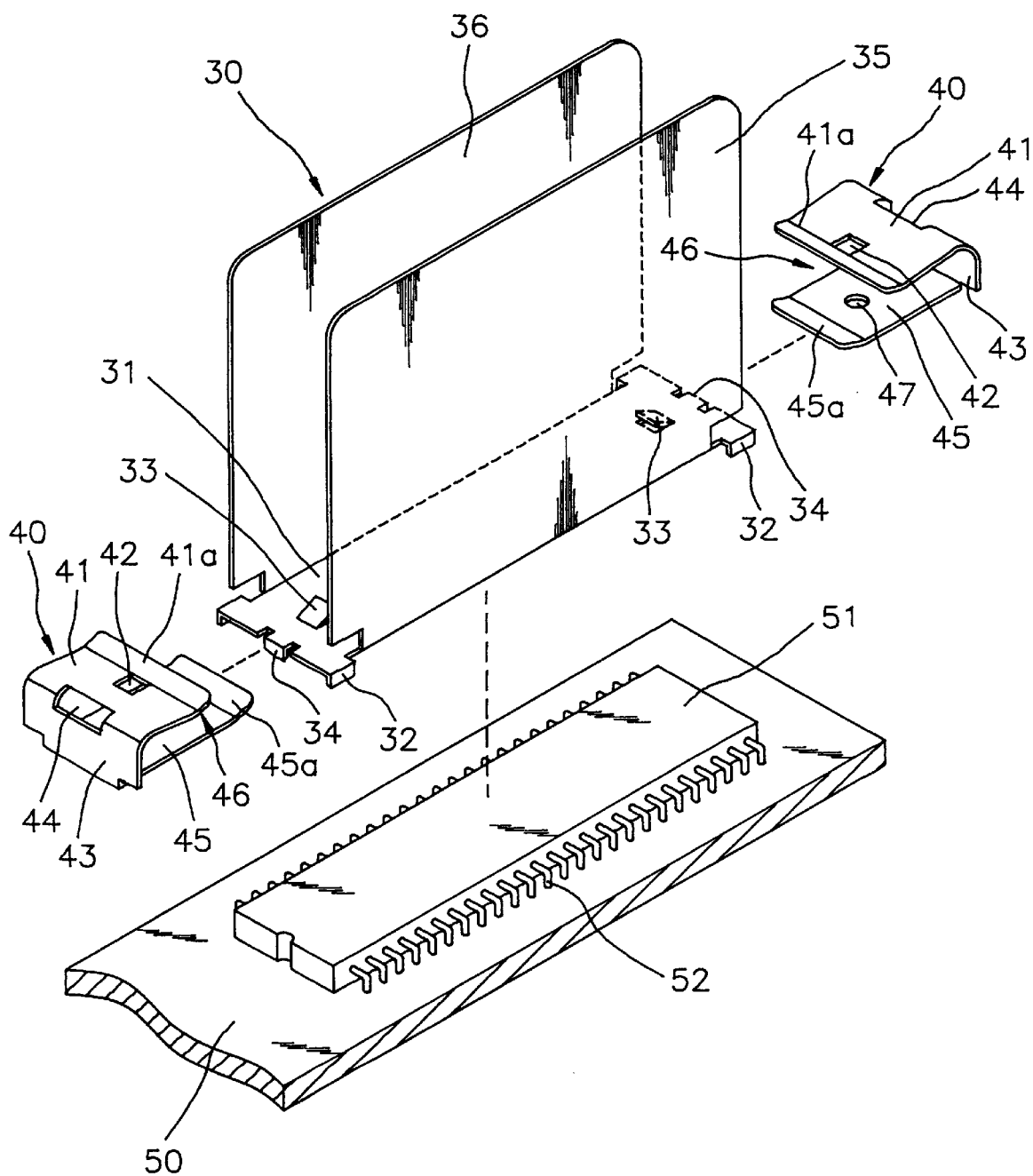
FIG. 2 shows an exploded perspective view of a heat dissipating device for an electronic device package in accordance with the present invention.

Referring to FIG. 2, there is shown an electronic device package 51, e.g., a microprocessor, provided with a plurality of leads 52 fixed to a main printed circuit board(PCB) 50 in an electronic appliance such as a video cassette recorder. In this set up, the electronic device package 51 is normally soldered to the main PCB 50, in such a way that there is a gap between bottom of the electronic device package and the main PCB 50.

On an upper surface of the electronic device package 51, a heat sink 30 for dissipating heat generated by the electronic device package 51 is installed. The heat sink 30 has a base 31 and a plurality of fins 35 and 36. The base 31 is shaped and dimensioned to substantially accommodate the electronic device package 51. The base 31 serves to transfer to the fins 35 and 36 the heat generated by the electronic device package 51 and transferred thereto from the electronic device package 51.

The base 31 includes a pair of tongues 33 located at opposite end parts of the base 31, respectively.

A plurality of first lugs 32 extend from both sides of the base 31 in a substantially vertically downward direction to limit the base 31 from moving in its widthwise deviation with respect to the electronic device package 51. It is preferable that the first lugs 32 are formed in such a manner that four protuberances are first shaped with the base 31 and then they are bent in a vertically downward direction to be perpendicular to the base 31. Although only four first lugs 32 are formed on the base 31 in this embodiment, the number of the first lugs 32 can be modified depending upon a shape or a dimension of the first lugs 32 and the base 31.

Formed on both end parts of the base 31 is a pair of second lugs 34 which vertically downwardly extends from the base 31. The second lugs 34 limit the base 31 from moving in a lengthwise direction of the electronic device package 51.

Meanwhile, the fins 35 and 36 are formed on the base 31, through which the heat transferred from the electronic device package 51 through the base 31 is dissipated to the surrounding atmosphere. The fins 35 and 36 extends upward from the base 31 to be approximately perpendicular to the base 31. The fins 35 and 36 should have large enough surface area and be made of a material having a good thermal conductivity, e.g., aluminum.

The heat sink 30 constructed in this manner is detachably fixed on the electronic device package 51 by a pair of clips 40. The clips 40 are used to fix the base 31 onto the electronic device package 51 to thereby keep the base 31 and the electronic device package 51 in a thermal contact. Each of the clips 40 is provided with a first leg 41 for elastically pressing the upper surface of the base 31, a second leg 45 for elastically pressing the lower surface of the electronic device package 51 and a center part 43 for connecting the two legs 41 and 45.

The first leg 41 has a housing hole 42 formed therethrough. The housing hole 42, in conjunction with the tongue 33, prevents the clip 40 from inadvertently moving from its clamping position, where the clip 40 exerts an enough depressing force on the base 31 and the electronic device package 51 to keep the same 31 and 51 in the thermal contact state. The tongue 33 is formed with the base 31 in such a manner that it cuts through the base 31 to be slantedly and elastically cantilevered with the base 31, forcing the clip 40 to easily attain the clamping position and at the same time, making it difficult for the clip 40 to deviate from the clamping position. The housing hole 42 has a substantially rectangular configuration. A free end of the first leg 41 is provided with a slant surface 41a upwardly slanted for facilitating setting the clip 40 over the upper surface of the base 31.

The center part 43 of the clip 40 is integrally formed with the first leg 41, e.g., by a bending process, to be approximately perpendicular to the first leg 41. A second lug housing hole 44 is formed on the center part 43, into which the second lug 34 on the base 31 is inserted when the clip 40 is moved toward its clamping position. Preferably, the second lug housing hole 44 is of a rectangular configuration. It is also preferable that height of the center part 43 is generally equal to or slightly greater than thickness of the electronic device package 51.

The second leg 45 extends from the center part 43, facing the first leg 41. A free end of the second leg 45 has a slant surface 45a bent toward the first leg 41 in a given angle in order to allow the clip 40 to firmly clamp together the base 31 and the electronic device package 51. The second leg 45 has a piercing hole 47 for facilitating an elastic deformation of the second leg 45.

Figure 3:
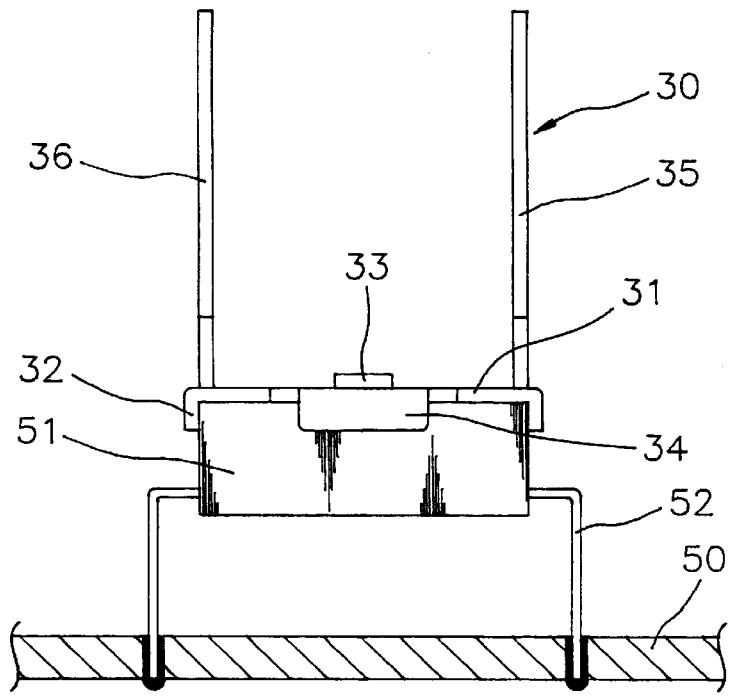
FIGS. 3 and 4 depict side elevational views for showing an assembling process of the inventive heat dissipating device onto the electronic device package.
Figure 4:
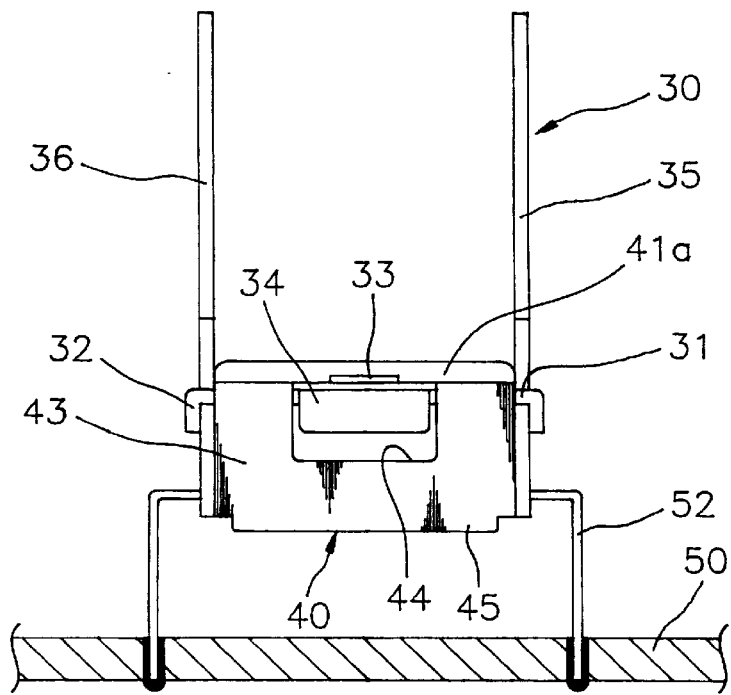

The following describes an assembling process of the inventive heat dissipating device onto the electronic device package 51 with reference to FIGS. 2, 3 and 4.

As shown in FIG. 3, the electronic device package 51 is mounted on the main printed circuit board 50, with a gap therebetween. First, the heat sink 30 is positioned on top of the electronic device package 51, the first and second lugs 32 and 34 preventing the base 31 from unnecessarily moving. Then, the clips 40 are arranged for clamping the heat sink 30 and the electronic device package 51 in such a manner that an opening 46 of each of the clips 40 faces each other, as shown in FIG. 2, and are pushed toward each other until the first and the second legs 41 and 45 of each thereof press onto the upper surface of the base 31 and the lower surface of the electronic device package 51, as shown in FIG. 4. At the clamping position, the first leg 41 and the second leg 45 each of the clips 40 come into a resilient contact with the upper surface of the base 31 and the lower surface of the electronic device package 51, respectively. Further, at the clamping position of the clips 40, the tongues 33 of the base 31 latch in the housing hole 42 of each of the first legs 41, and the second lugs 34 of the base 31 are inserted into the second lug housing hole 44 of the center part 43 of each of the clips 40, thereby allowing the clips 40 to firmly clamp the electronic device package 51 and the heat sink 30.

In the inventive heat dissipating device assembled onto the electronic device package 51 in this manner, the heat from the electronic device package 51 is first transferred to the base 31 of the heat sink 30 through its upper surface, and then is dissipated to the surrounding atmosphere through the fins 35 and 36.

Although the invention has been shown and described with respect to the preferred embodiments, it will be understood by those skilled in the art that various changes and modifications may be made without departing from the spirit and scope of the invention as defined in the following claims.

What is claimed is:

1. A device dissipating heat generated from an electronic device package being spaced apart from an upper face of a printed circuit board, said device comprising:

a heat sink having a base in contact with an upper face of said electronic device package and at least one fin formed on said base to dissipate the heat from said electronic device package; and a pair of clips clamping the base and the electronic device package positioned beneath the base in order to maintain a close thermal contact between the base and the electronic device package, each of the clips comprises an opened rectangular shape including a center part, a first leg extending from one end of said center part in an elastic contact with the upper face of said base, and a second leg extending from the other end of said center part and positioned between a lower face of said electronic device package and the upper face of the printed circuit board, said second leg is in an elastic contact with the lower face of said electronic device package.

2. The device as recited in claim 1, wherein said base further comprises a positioning means for properly positioning the heat sink onto the electronic device package and for preventing the positioned base from unnecessarily moving.

3. The device as recited in claim 1, wherein said each of the clips further comprises secession preventing means for preventing said clip seceding from a clamping position thereof.

4. The device as recited in claim 1, wherein said first leg has a slant end surface for facilitating an approach of the clip toward the clamping position of the clip.

5. The device as recited in claim 1, wherein said second leg comprises an extension formed on its free end, the extension being slanted in a given angle toward said first leg in order to allow the clip to firmly clamp the base and the electronic device package.

6. The device as recited in claim 1, wherein said second leg comprises a through hole for facilitating an elastic deformation of the second leg.

7. The device as recited in claim 2, wherein said positioning means comprises four widthwise movement limiting lugs and a pair of lengthwise movement limitation lugs on said base, said lugs extending downwardly from said base.

8. The device as recited in claim 3, wherein said secession preventing means comprises a tongue member formed on said base and a receiving hole formed on said first leg of said clip, for receiving said tongue member.

* * * * *